Jan. 18, 1966 A. D. EVANS 3,230,428
FIELD-EFFECT TRANSISTOR CONFIGURATION
Filed May 2, 1960
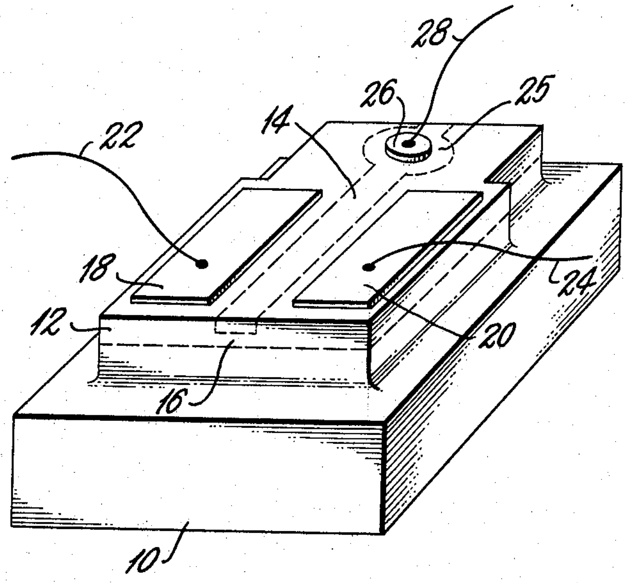
INVENTOR.
Arthur D. Evans
BY
Stevens, Davis, Miller & Mosher
ATTORNEYS United States Patent Office 3,230,428

Patented Jan. 18, 1966

3,230,428

FIELD-EFFECT TRANSISTOR CONFIGURATION

Arthur D. Evans, Farmers Branch, Tex., assignor to Texas Instruments Incorporated, Dallas, Tex., a corporation of Delaware Filed May 2, 1960, Ser. No. 26,336
5 Claims. (Cl. 317—234)

This invention relates to a novel semiconductor field-effect transistor configuration.

In general, field-effect transistors are an active circuit element whereby conduction of current through the device is by a single type of carrier. The field-effect transistor defines a current path or channel composed of single crystal semiconductor material of one conductivity type, say p-type, and a gate region composed of opposite conductivity type semiconductor material. Thus, a p-n junction is formed between the current path and the gate. The forming of the p-n junction between the channel (current path) and the gate is critical in that the current path must be kept to very small and critical dimensions. A practical depth of the channel is, for instance, about .01–.03 mils, and the length of the channel is, for instance, about 1 mil.

Intially, it was proposed to form the p-n junction by alloying techniques. These techniques are hard to control in regards to the size of the junction made and the depth to which the alloying penetrated into the semiconductor body. This is because of the fast alloying rate that characterizes most materials. Also, reproducibility on a production basis is a hard factor to achieve using alloying.

At present, the diffusion techniques for forming p-n junctions are used, because of the ease in controlling the amount of impurity diffused into a material, the depth of penetration and the ability to reproduce a device on a production basis. It is also advantageous because it proceeds more slowly and the semiconductor material retains its solid state during the process of forming the p-n junction. There is always the danger of altering the material parameters in the process of metling and solidifying as in the alloying technique.

To complete the field-effect transistor, ohmic contacts are formed to each end of the channel to carry the current in and out of the device. One contact is called the source and the other designated as the drain. A third ohmic contact is formed to the gate to apply a bias voltage to the device. A fabrication problem is encountered when attempting to form an ohmic contact to the gate as its width is in the order of 1 mil.

The present invention advantageously overcomes the problem of having to form an ohmic contact to an area of such tiny dimensions. It must be noted that the length of the gate of the device is not critical. The feature of this invention that overcomes the ohmic contact problem is the extension of the gate lengthwise away from the channel area and enlarging the width of the gate in this remote region. The remote, enlarged region of the gate can be of any desired shape, for example, it can be shaped as a bulb having a diameter of say, 10 mils. This dimension is large enough to enable a suitable ohmic contact to be made to the gate. Thus, the present invention allows the fabrication of a field-effect transistor with a gate of necessarily small dimensions in the critical channel region and having an extension of the gate lengthwise characterized by enlarged dimensions in a non-critical region to allow the forming of a suitable ohmic contact to the gate.

It is one object of this invention to provide a solid semiconductor element fabrication process for fabricating field-effect elements with ease such that the fabrication technique is reproducible on a production basis.

It is still another object of this invention to provide a method for fabricating an active solid semiconductor element that lends itself to circuit miniaturization.

It is still another object of this invention to provide a method for fabricating an active solid semiconductor element of extremely small dimensions.

It is still a further object of this invention to provide a method for fabricating a field-effect transistor with a gate of necessarily small dimensions in such a way as to obtain an enlarged gate dimension in a non-critical region, thereby allowing suitable ohmic contact to be formed to the gate.

Other and further objects of this invention will become more readily apparent from the following detailed description of a preferred embodiment of the invention when taken in conjunction with the sole figure of the drawing which shows in perspective the preferred embodiment.

Referring to the drawing, there is shown a field-effect transistor made from a single piece of semiconductor material. This transistor is made by known diffusion techniques starting with a 5 mil thick, n-type, single crystal silicon wafer 10 (7–9 ohm-cm. resistivity). A suitable p-type diffused layer 12 is produced in one face of wafer 10, as shown. An n-type diffused layer 14 about 1 mil wide is defined in the p-type diffused layer 12. The portion 16 of the p-region 12 beneath the layer 14 is the channel of the field-effect device and is made about 0.02 to 0.05 mil thick. Metal contacts 18 and 20 are attached to the p-type diffused layer 12 on opposite sides of the n-type diffused layer 14. Leads 22 and 24 are attached to contact 26. It will be noted that the wafer is the narrowness of gate 14, difficulty is encountered in making an ohmic contact. Therefore, the gate includes an extension 25, which is bulb-shaped. This bulb 25 is made in the order of 10 x $10^{-3}$ inches and is large enough to accommodate an ohmic contact 26. Lead 28 is attached to contact 26. It wil be noted that the wafer is mesa etched so that the active portion of the transistor is located on a projecting portion of the wafer.

This field-effect transistor can be used in conjunction with other circuit elements either separately or can be integrated into a solid state circuit. This device is particularly desirable as it allows contact to be made easily to narrow gate 14.

The wafer 10 can be made of any suitable semiconductor material although silicon is preferred. Known impurities can be used during fabrication and the diffusion processes are carried out in a conventional manner. No effort is made to describe these aspects of fabrication in greater detail than given above as they form no part of the invention and are so well known in the art.

Although the invention has been shown and described in terms of a single preferred embodiment, changes will occur to those skilled in the art which do not in fact depart from the teachings of the invention. Such changes are deemed to fall within the purview of the invention.

What is claimed is:

1. A field-effect transistor configuration comprising a semiconductor wafer of one type conductivity having a first diffused layer of opposite type conducitivity defined in one face thereof and a second diffused layer of said one type conductivity defined in the face of said first diffused layer, said second diffused layer comprising a relatively narrow portion to establish a thin short channel in said first diffused layer and an enlarged terminal portion, a pair of contacts attached to said first diffused layer on opposite sides of the narrow portion of said second diffused layer, and a contact attached solely to said enlarged portion of said second diffused layer.

2. A field-effect transistor configuration as defined in claim 1 wherein said channel is about 1 mil long and from about 0.02 to about 0.05 mil thick.

3. A field-effect transistor configuration as defined in claim 1 wherein said wafer is composed of n-type silicon.

4. A field-effect transistor configuration comprising a wafer of semiconductor material of one conductivity type, a surface region of opposite conductivity type defined in the face of said wafer, an elongated narrow region of said one conductivity type defined in the surface of said surface region and separating said surface region into first and second portions, said first and second portions being connected only by a channel underlying said narrow region, said narrow region having an enlarged extension defined in the surface of said surface region, first and second conductive means attached to said first and second portions respectively, and a third conductive means attached solely to said enlarged extension, said third conductive means being wide relative to said narrow region, the narrow region being free of said third conductive means.

5. A field-effect transistor comprising a wafer of monocrystalline semiconductor material, a shallow surface region defined in the wafer adjacent one major face thereof composed of semiconductor material of conductivity-type opposite that immediately underlying said surface region, an elongated narrow diffused gate region defined in the surface region but separated therefrom by a P-N junction, the gate region separating the surface region into a source and drain which are connected to one another within the wafer only by a thin channel underlying the gate region, an enlarged extension of the gate region defined in the surface region and extending laterally along said major face to an extent much greater than the shortest lateral dimension of the gate region, a pair of metallic contacts separately engaging the source and drain on said one major face, and another metallic contact disposed solely on said enlarged extension to provide a gate contact, the elongated gate region being free of the metallic contact.

References Cited by the Examiner

UNITED STATES PATENTS

| | | | |
|---|---|---|---|
| 2,502,479 | 4/1950 | Pearson et al. | 317—235 |
| 2,862,115 | 11/1958 | Ross | 317—235 X |
| 2,887,415 | 5/1959 | Stevenson | 148—1.5 |
| 2,909,715 | 10/1959 | Adcock | 317—235 |
| 3,010,033 | 11/1961 | Noyce | 307—88.5–21.4 |

JOHN W. HUCKERT, *Primary Examiner.*

SAMUEL BERNSTEIN, GEORGE N. WESTBY, DAVID J. GALVIN, *Examiners.*